US012635582B2

(12) United States Patent
Naito

(10) Patent No.: US 12,635,582 B2
(45) Date of Patent: May 19, 2026

(54) OPTICAL DEVICE AND METHOD OF MANUFACTURING OPTICAL DEVICE

(71) Applicant: SEIKO NPC CORPORATION, Tokyo (JP)

(72) Inventor: Takahiro Naito, Tokyo (JP)

(73) Assignee: SEIKO NPC CORPORATION, Tokyo (JP)

( * ) Notice: Subject to any disclaimer, the term of this patent is extended or adjusted under 35 U.S.C. 154(b) by 371 days.

(21) Appl. No.: 18/212,942

(22) Filed: Jun. 22, 2023

(65) Prior Publication Data

US 2024/0038747 A1     Feb. 1, 2024

(30) Foreign Application Priority Data

Jul. 28, 2022     (JP) ................................. 2022-120795

(51) Int. Cl.
| | |
|---|---|
| *H01L 23/00* | (2006.01) |
| *H01L 25/16* | (2023.01) |
| *H10W 74/01* | (2026.01) |
| *H10W 90/00* | (2026.01) |
| *H10W 72/50* | (2026.01) |
| *H10W 72/90* | (2026.01) |

(52) U.S. Cl.
CPC ......... *H10W 90/00* (2026.01); *H10W 74/014* (2026.01); *H10W 74/017* (2026.01); *H10W 72/5366* (2026.01); *H10W 72/5445* (2026.01); *H10W 72/9445* (2026.01); *H10W 90/754* (2026.01)

(58) Field of Classification Search
CPC ... H01L 25/167; H01L 21/561; H01L 21/565; H01L 21/566; H01L 24/06; H01L 24/48; H01L 24/49
See application file for complete search history.

(56) References Cited

U.S. PATENT DOCUMENTS

| | | |
|---|---|---|
| 2004/0089859 A1 | 5/2004 | Shirakawa et al. |
| 2006/0227236 A1 | 10/2006 | Pak |
| 2009/0097139 A1 | 4/2009 | Masanori et al. |

(Continued)

FOREIGN PATENT DOCUMENTS

| | | |
|---|---|---|
| JP | 2003273371 A1 | 9/2003 |
| JP | 2006295928 A | 10/2006 |

(Continued)

*Primary Examiner* — Walter H Swanson
(74) *Attorney, Agent, or Firm* — BROOKS KUSHMAN P.C.

(57) ABSTRACT

An optical device includes: an optical element that is rectangular as seen in a top view, and that has a light-receiving portion at a top surface thereof; a wiring substrate on which the optical element is mounted; wires electrically connecting the optical element and the wiring substrate at from one to three sides of the rectangular optical element; a resin portion formed at a periphery of the optical element, and covering a portion of the top surface of the optical element including the wires; and an opening portion that is concave, that is provided in the resin portion, and that is formed by a molding die such that at least the light-receiving portion and the top surface at a periphery of the light-receiving portion are exposed, wherein the resin portion that structures a bottom surface at the opening portion is flush with the top surface.

9 Claims, 11 Drawing Sheets

(56)     References Cited

U.S. PATENT DOCUMENTS

| | | |
|---|---|---|
| 2015/0069113 A1 | 3/2015 | Wang et al. |
| 2015/0187649 A1 | 7/2015 | Yoneta et al. |
| 2019/0081028 A1 | 3/2019 | Komiyama et al. |
| 2021/0090908 A1* | 3/2021 | Renjan .................... H01L 24/13 |

FOREIGN PATENT DOCUMENTS

| | | |
|---|---|---|
| JP | 2006303484 A | 11/2006 |
| JP | 2009099680 A | 5/2009 |
| JP | 2010199410 A | 9/2010 |
| JP | 2014003091 A | 1/2014 |
| JP | 2016092021 A | 5/2016 |
| JP | 2019047011 A | 3/2019 |
| WO | 2017208724 A1 | 3/2019 |

* cited by examiner

OPTICAL DEVICE AND METHOD OF MANUFACTURING OPTICAL DEVICE

CROSS-REFERENCE TO RELATED APPLICATIONS

This application claims priority to Japanese Patent Application No. 2022-120795 filed on Jul. 28, 2022, the disclosure of which is incorporated by reference herein in its entirety.

BACKGROUND

Technical Field

The present invention relates to an optical device and a method of manufacturing an optical device.

Related Art

The optical device and method of manufacturing thereof that are disclosed in Japanese Patent Application Laid-Open (JP-A) No. 2009-99680 for example are known as an optical device and a method of manufacturing the optical device.

SUMMARY

In the optical device of JP-A No. 2009-99680, an optical element is mounted on a wiring substrate, and portion of the optical element, which is other than the optical function area thereof that receives light, is sealed by a resin.

Because the resin is formed by a molding die, a new molding die must be prepared in order to change the shape of a semiconductor package.

For example, if an optical element having a large optical function area is sealed by a resin by using a molding die that corresponds to an optical element having a small optical area, a portion of the large optical function area will be covered by the resin.

Therefore, in a case of molding an optical element having a large optical function area by a resin, a new molding die for forming a large opening at the resin portion must be prepared in order for the optical function area not to be covered by the resin, and there is room for improvement in manufacturing the optical device.

In this way, in a conventional optical device having an opening that exposes the optical function area, if the size of the element or the size of the light-receiving portion changes, a molding die that is suited thereto must be prepared each time, which is disadvantageous in terms of costs, development time and the like, and there is room for improvement.

That is, depending on the width of the light-receiving portion, some of the light-receiving element will be covered by the resin. Therefore, there are optical devices that can be mounted to a wiring substrate, and there are optical devices that cannot be mounted.

In view of the above-described circumstances, an object of the present disclosure is to provide an optical device and a method of manufacturing an optical device in which the size of a light-receiving element that is to be mounted and the size of a light-receiving portion of the light-receiving element can be changed, without changing the molding die for resin molding.

An optical device of a first aspect includes: an optical element that is rectangular as seen in a top view, and that has a light-receiving portion at a top surface thereof; a wiring substrate on which the optical element is mounted; wires electrically connecting the optical element and the wiring substrate at from one to three sides of the rectangular optical element; a resin portion formed at a periphery of the optical element, and covering a portion of the top surface of the optical element including the wires; and an opening portion that is concave, that is provided in the resin portion, and that is formed by a molding die such that at least the light-receiving portion and the top surface at a periphery of the light-receiving portion are exposed, wherein the resin portion that structures a bottom surface at the opening portion is flush with the top surface.

In the optical device of the first aspect, the optical element that is rectangular and has the light-receiving portion at the top surface thereof is mounted to the wiring substrate. The optical element and the wiring substrate are electrically connected by wires at from one to three sides of the optical element.

The resin portion, which covers a portion of the top surface of the optical element including the wires, is provided at the periphery of the optical element. Therefore, the wires are sealed and protected by the resin of the resin portion.

The concave opening portion is formed in the resin portion. This opening portion is formed by a molding die such that the light-receiving portion, and the top surface of the optical element at the periphery of the light-receiving portion, are exposed at the bottom surface. The resin portion that structures the bottom surface at the opening portion is flush with the top surface of the optical element.

Because the opening portion is formed by a molding die, the shape and the size of the opening portion cannot be changed if the molding die is not changed.

In the optical device of the first aspect, the resin portion, which structures the bottom surface at the opening portion, is flush with the top surface of the optical element that is exposed at the opening portion. Therefore, without changing the molding die, the size of the optical element as viewed in a top view can be increased, and the size of the light-receiving portion can be increased so as not to be covered by the resin portion.

Note that, because the light-receiving portion of the optical element is exposed at the opening portion, a resin material that does not transmit light can be used at the resin portion.

In an optical device of a second aspect, in the optical device of the first aspect, connection terminals that connect the wires are not provided at two sides among four sides of the optical element, and light-receiving portions are provided respectively along the two sides at which the connection terminals are not provided.

In the optical device of the second aspect, light-receiving portions are provided respectively along the two sides at which connection terminals are not provided. Therefore, two light-receiving portions can be placed without being limited by the arrangement of the connection terminals. In the optical device of the second aspect, different lights can be received at the two light-receiving portions, or the same light can be received at the two light-receiving portions.

In an optical device of a third aspect, in the optical device of the second aspect, the light-receiving portions are formed in elongated shapes along the sides, and plural pixels are arrayed along length directions of the light-receiving portions.

In the optical device of the third aspect, because plural pixels are arrayed along the length directions of the light-receiving portions, the light-receiving portions can be made to function as line sensors.

In an optical device of a fourth aspect, in the optical device of any one of the first through third aspects, a through-portion, which passes through the resin portion and exposes a surface of a portion of the wiring substrate, is provided at a portion of the opening portion, and a light-emitting element is provided at the wiring substrate that is exposed from the through-portion.

In the optical device of the fourth aspect, the through-portion, which passes through the resin portion and exposes the surface of a portion of the wiring substrate, is provided at a portion of the opening portion. A light-emitting element is provided at the wiring substrate that is exposed from the through-portion.

Therefore, the light that is emitted from the light-emitting element can be illuminated via the through-portion of the opening portion onto an object of illumination provided at the exterior of the optical device.

Further, in the optical device of the fourth aspect, the light emitted from the optical device is illuminated onto the object of illumination, and the reflected light that is reflected by the object of illumination can be received at the light-receiving portion.

A method of manufacturing an optical device of a fifth aspect is a method of manufacturing an optical device that includes an optical element having a light-receiving portion, and a wiring substrate on which the optical element is mounted and that is electrically connected to the optical element via wires, the method including a resin molding step of molding at least the wires and a portion of the optical element by a resin by using a molding die, wherein the molding die has a cavity portion that is concave and into which resin for molding is filled, and wherein the cavity portion has a contacting portion that is planar, that contacts the light-receiving portion and a surface of the optical element at a periphery of the light-receiving portion such that the light-receiving portion and the surface of the optical element at the periphery of the light-receiving portion are not covered by the resin, and that forms an optical element periphery portion that is formed by the resin and is flush with the surface.

In accordance with the method of manufacturing an optical device of the fifth aspect, in the resin molding step, at least the wires and a portion of the optical element are sealed by resin by using a molding die.

The molding die that is used in the resin molding step has the concave cavity portion in which the resin for molding is filled.

The cavity portion has a planar contacting portion that contacts the light-receiving portion and the surface of the optical element at the periphery of the light-receiving portion such that the light-receiving portion and the surface of the optical element at the periphery of the light-receiving portion are not covered by the resin, and that forms an optical element periphery portion that is formed by the resin and is flush with that surface.

Therefore, when the wiring substrate on which an optical element is to be mounted is placed within the molding die, the contacting portion provided at the cavity portion contacts the light-receiving portion and the surface of the optical element at the periphery of the light-receiving portion.

In this state, the resin for molding is filled into the space of the cavity portion, and when the resin cures, the wires and the necessary places at portions of the optical element are sealed by the resin. Then, there is obtained the optical device in which the optical element periphery portion, which is formed of the resin and is flush with the surface of the optical element, is formed at the periphery of the optical element, and in which the light-receiving portion and the surface of the optical element at the periphery of the light-receiving portion are not covered by the resin.

Accordingly, in accordance with the method of manufacturing an optical device of the fifth aspect, without changing the molding die, it is possible to manufacture the optical device in which the size, as viewed in a top view, of the optical element mounted to the wiring substrate can be increased, and also the size of the light-receiving portion can be increased.

Because the light-receiving portion of the optical element is not covered by resin, a resin material that does not transmit light can be used for the resin.

As described above, in accordance with the optical device of the present invention, the sizes of the light-receiving element that is mounted and the light-receiving portion can be changed without changing the molding die for resin molding.

As described above, in accordance with the method of manufacturing an optical device of the present invention, the sizes of the light-receiving element that is mounted and the light-receiving portion can be changed without changing the molding die for resin molding.

BRIEF DESCRIPTION OF THE DRAWINGS

Preferred embodiments will be described in detail based on the following figures, wherein.

DETAILED DESCRIPTION

First Embodiment

Figure 1:
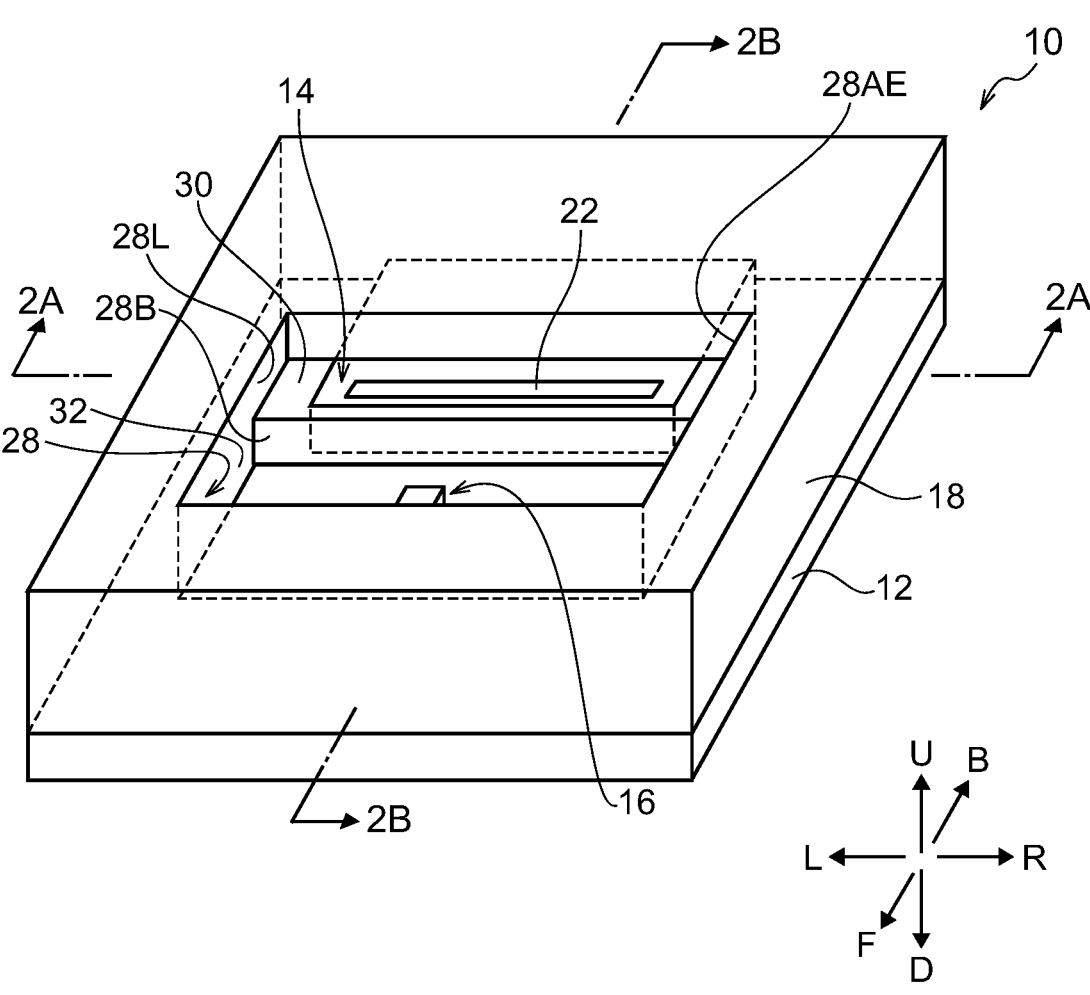
FIG. 1 is a perspective view illustrating an optical device relating to a first embodiment.

An optical device 10 relating to a first embodiment of the present invention is described by using FIG. 1 through FIG. 6. Note that the up-down distinction in the following description is made for convenience, but does not limit the upward and downward directions at the time of actual use of the optical device.

In the present embodiment, for convenience, the arrow U direction side in the drawings is the upper side, the arrow D direction side in the drawings is the lower side, the arrow L direction side in the drawings is the left side, the arrow R direction side in the drawings is the right side, the arrow F direction side in the drawings is the front side, and the arrow B direction side in the drawings is the rear side. Further, the arrow U direction in the drawings is called the upward direction, the arrow D direction in the drawings is the called the downward direction, the arrow L direction in the drawings is called the leftward direction, the arrow R direction in the drawings is called the rightward direction, the arrow F direction in the drawings is called the frontward direction, and the arrow B direction in the drawings is called the rearward direction.

(Structure of Optical Device)

Figure 2A:
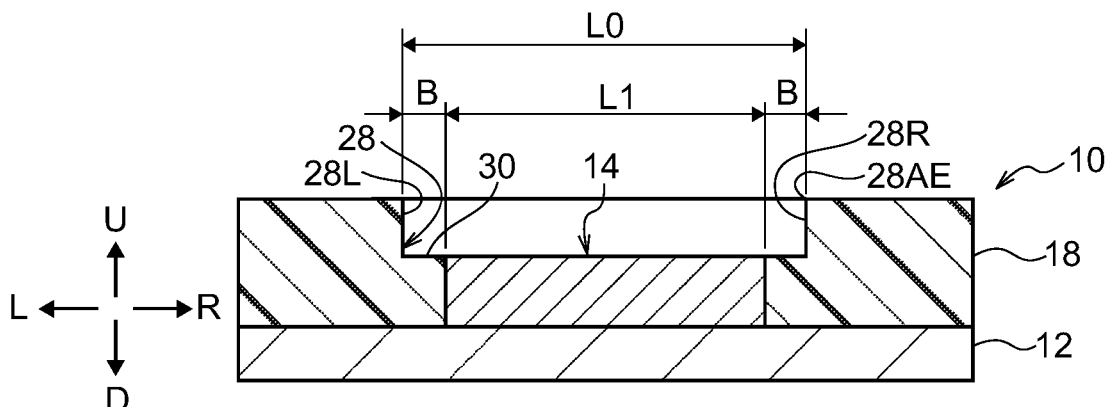
FIG. 2A is a cross-sectional view along line 2A-2A of the optical device illustrated in FIG. 1.
Figure 2B:
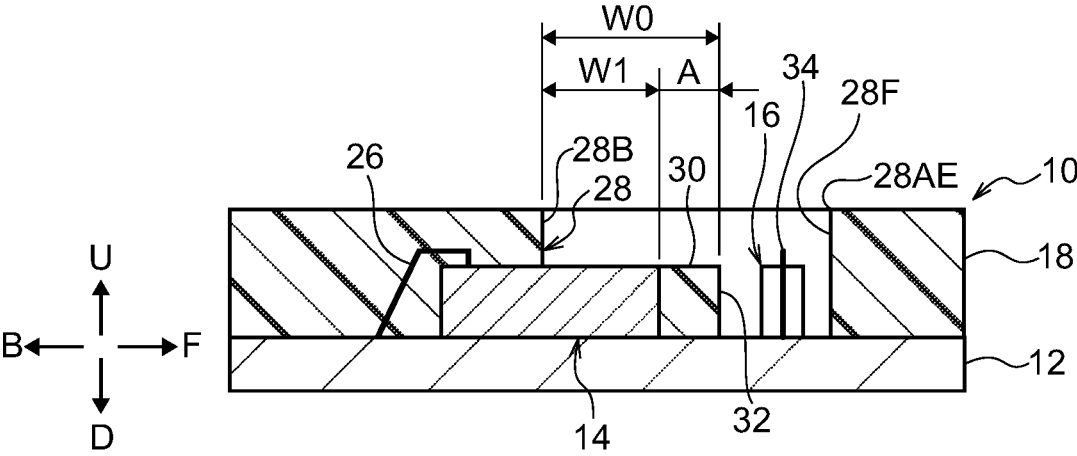
FIG. 2B is a cross-sectional view along line 2B-2B of the optical device illustrated in FIG. 1.

As illustrated in FIG. 1, FIG. 2A and FIG. 2B, the optical device 10 of the present embodiment is structured to include a wiring substrate 12, an optical element 14, a light-emitting element 16, a resin portion 18 formed of a resin for molding, and the like, and is structured as a so-called reflective-type photo interrupter, and is used at an encoder or the like as an example.

Figure 3A:
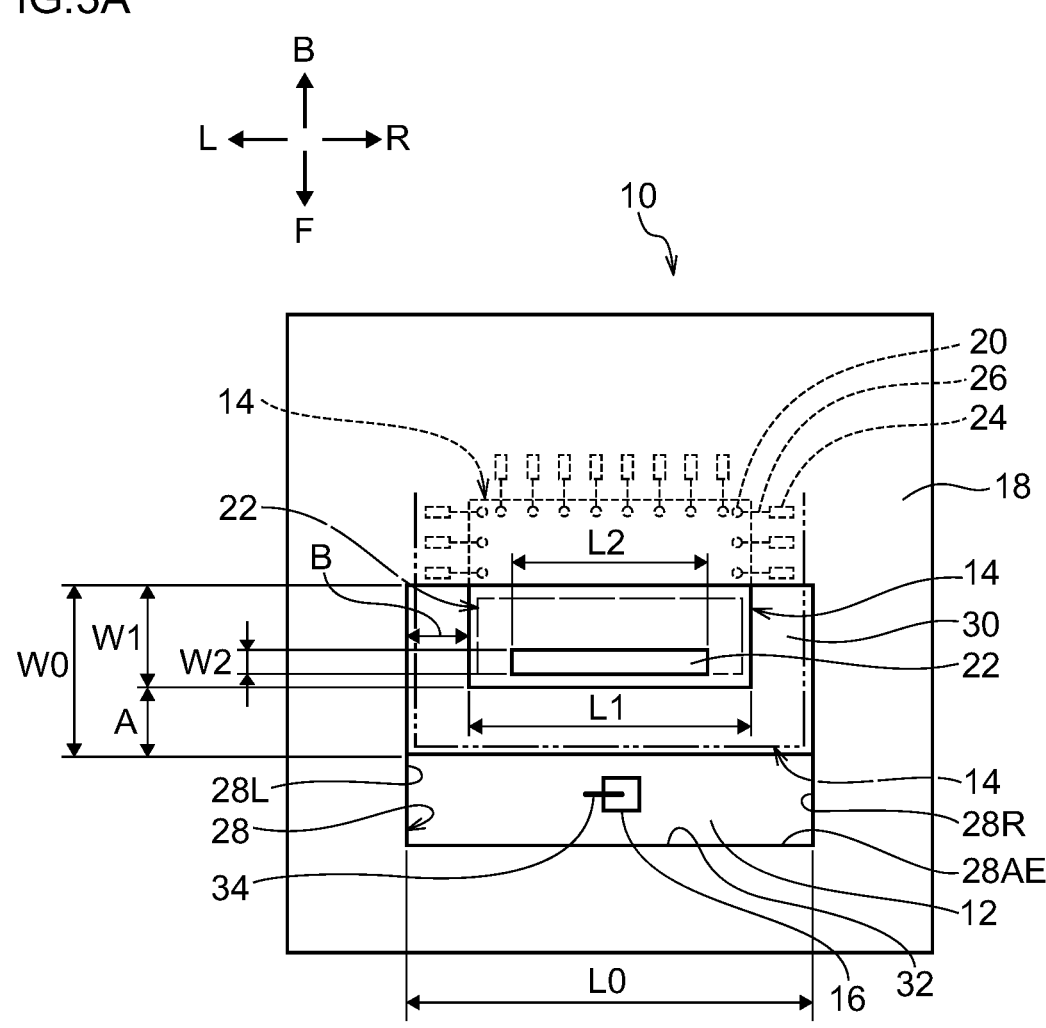
FIG. 3A is a plan view illustrating the optical device relating to the first embodiment.

The wiring substrate 12 is formed in a rectangular shape. As illustrated in FIG. 1 and FIG. 3A, the optical element 14 that is formed in a rectangular shape is mounted to the top surface of the wiring substrate 12.

The optical element 14 is formed to be smaller than the wiring substrate 12. Plural electrode pads 20 are provided at the optical element 14 of the present embodiment on the top surface thereof (the surface at the arrow U direction side in FIG. 2A) along the side at the arrow L direction side, the side at the arrow B direction side, and the side at the arrow R direction side.

As illustrated in FIG. 3A, a rectangular (elongated) light-receiving portion 22 is provided at the top surface of the optical element 14 along the side at the arrow F direction side at which the electrode pads 20 are not provided. The surface area of the light-receiving portion 22 when the optical element 14 is seen in a top view is smaller than that of the top surface of the optical element 14 that is exposed at an opening portion 28.

Figure 3B:
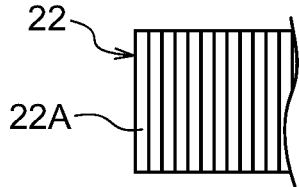
FIG. 3B is an enlarged plan view illustrating a portion of a light-receiving portion of the optical device relating to the first embodiment.

The length direction of the light-receiving portion 22 is parallel to the side at the arrow F direction side of the optical element 14. As illustrated in FIG. 3B, photodiodes 22A that are an example of plural pixels are disposed at the light-receiving portion 22 of the present embodiment at a uniform interval along the length direction of the light-receiving portion 22. In other words, the light-receiving portion 22 of the present embodiment functions as a line sensor.

As illustrated in FIG. 3A, plural electrode pads 24 are provided at the wiring substrate 12 at the periphery of the optical element 14 at positions adjacent to the electrode pads 20 of the optical element 14.

The electrode pads 20 of the optical element 14 and the electrode pads 24 of the wiring substrate 12 are electrically connected by bonding wires 26.

As illustrated in FIG. 1 through FIG. 3, a portion of the wiring substrate 12, a portion of the optical element 14, and the bonding wires 26 are covered by the resin portion 18. The top surface of the resin portion 18 is positioned further upward than the upper ends of the bonding wires 26, such that the bonding wires 26 are embedded in the resin. The top surface of the resin portion 18 is formed in the shape of a plane that is parallel to the wiring substrate 12. Note that, as an example, a black resin that is used in general semiconductor packages is used at the resin portion 18 of the present embodiment.

The opening portion 28 that is concave is formed in the center of the resin portion 18. An opening edge 28AE of the opening portion 28 at the top surface of the resin portion 18 is formed in a rectangular shape. The opening portion 28 has a bottom surface 30 that is flush with the top surface of the optical element 14, and a through-portion 32 that is provided at the arrow F direction side of the bottom surface 30 and exposes a portion of the top surface of the wiring substrate 12.

Note that the resin portion that has the bottom surface 30 and stands-up from the top surface of the wiring substrate 12 is an example of the optical element periphery portion of the present invention.

As illustrated in FIG. 2A and FIG. 2B, a side surface 28F at the arrow F direction side, a side surface 28B at the arrow B direction side, a side surface 28L at the arrow L direction side, and a side surface 28R at the arrow R direction side of the opening portion 28 respectively are substantially orthogonal to the wiring substrate 12. Note that the reason why these surfaces are made to be substantially orthogonal is in order to provide the side surface 28F, the side surface 28B, the side surface 28L and the side surface 28R with draft angles for pulling the resin portion 18 out from an upper molding die 40A that is described later and that is for forming the opening portion 28. Note that angles that are larger than usual draft angles that are provided at the time of resin molding may be provided at the side surface 28F, the side surface 28B, the side surface 28L and the side surface 28R.

As illustrated in FIG. 1 through FIG. 3, the optical element top surface at the periphery of the light-receiving portion 22 except for the area where the bonding wires 26 are disposed at the optical element 14, and the top surface of the bottom surface 30, are exposed at the opening portion 28. In further detail, the top surface of the bottom surface 30 is exposed at the arrow L direction side, the arrow F direction side and the arrow R direction side of the optical element 14 that are exposed at the opening portion 28.

As illustrated in FIG. 2A and FIG. 3A, length L0 of the bottom surface 30 in the left-right direction is longer than length L1 of the optical element 14 in the left-right direction (which is also the length exposed at the bottom surface 30). Width W0 of the bottom surface in the front-rear direction is wider than width W1, in the front-rear direction, of the optical element 14 that is exposed at the bottom surface 30 of the opening portion 28.

As illustrated in FIG. 3A, at the optical element 14 that is used in the optical device 10 of the present embodiment, length L2 of the light-receiving portion 22 in the left-right direction is shorter than the length L1 of the optical element 14 in the left-right direction, and width W2 of the light-receiving portion 22 in the front-rear direction is narrower than the width W1, in the front-rear direction, of the optical element 14 that is exposed at the bottom surface 30.

Accordingly, at the optical element 14 illustrated in FIG. 3A, there is leeway for lengthening the light-receiving portion 22 at the both sides in the left-right direction of the light-receiving portion 22, and there is leeway for widening the light-receiving portion 22 toward the rear side of the light-receiving portion 22.

In FIG. 3A, the two-dot chain line illustrates the light-receiving portion 22 whose length and width have been increased.

Further, in FIG. 3A, the one-dot chain line illustrates the optical element 14, the length and width of which have been increased.

Further, at the optical device 10 of the present embodiment, as illustrated in FIG. 2A, FIG. 2B and FIG. 3A, given that, at the interior of the opening portion 28, of the resin portion 18 that surrounds the periphery of the optical element 14 at the bottom surface 30 of the opening portion 28, The width of the resin portion 18 between the through-portion 32 and one side of the optical element 14 that faces the through-portion 32 is A, and the width of the resin portion 18 between the wall surface 28L, 28R of the opening portion 28 and another side that is adjacent to that one side of the optical element 14 is B, the dimensions are set such that A>B.

In other words, at the interior of the opening portion 28, thickness A [W0−W1] of the resin portion 18 that is positioned at a length direction side of the light-receiving portion 22 is set to be greater than thickness B [(L0−L1)/2], which is measured along the width direction of the light-receiving portion 22, of the resin portion 18 that is positioned at a width direction side of the light-receiving portion 22.

As illustrated in FIG. 1, FIG. 2B and FIG. 3A, the light-emitting element 16 that is an LED or the like is mounted to the central portion of the top surface of the wiring substrate 12 that is exposed by the opening portion 28. As illustrated in FIG. 2B and FIG. 3A, the light-emitting element 16 and the wiring substrate 12 are electrically connected by a bonding wire 34. The light-emitting element 16 of the present embodiment can emit light toward the upward direction of the wiring substrate 12.

(Method of Manufacturing Optical Device)

A molding die 40 for forming the resin portion 18 of the optical device 10 is illustrated in cross-sectional views in FIG. 2 and FIG. 4.

The molding die 40 is structured to include the upper molding die 40A and a lower molding die 40B. A cavity portion 42, which is concave and is for forming a continuous wiring substrate 12A (see FIG. 4C, FIG. 4D), the optical elements 14 and the resin portions 18, is formed in the molding die 40. Note that what is called the continuous wiring substrate 12A here means a substrate at which the individual wiring substrates 12 illustrated in FIG. 1 are connected continuously, and becomes the individual wiring substrates 12 by being cut later. Note that the light-emitting elements 16 are not mounted to the continuous wiring substrate 12A that is placed in the molding die 40.

Figure 4A:
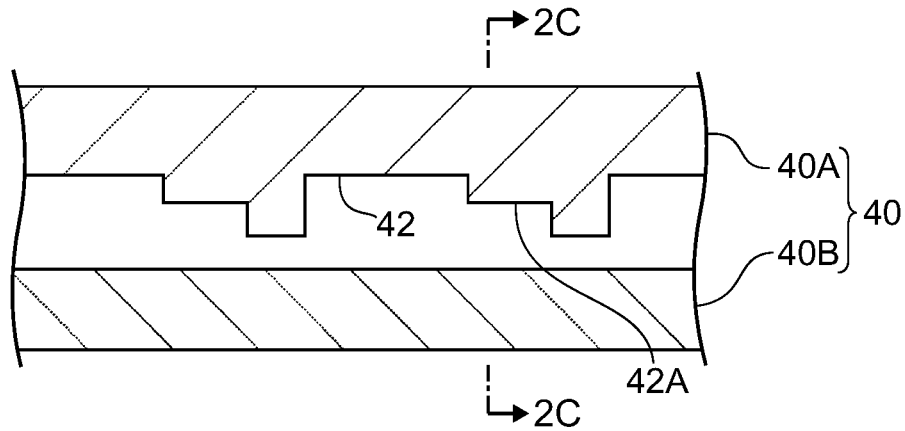
FIG. 4A is an explanatory drawing illustrating a step of carrying out resin molding.
Figure 4B:
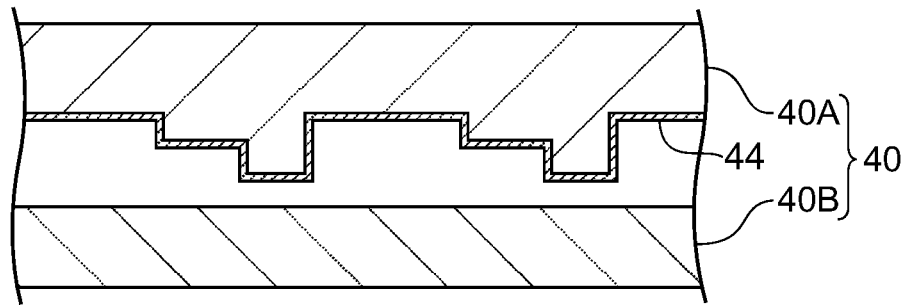
FIG. 4B is an explanatory drawing illustrating a step of carrying out resin molding.

(1) First, as illustrated in FIG. 4B, a synthetic resin sheet 44 that is flexible and peelable is laminated on the lower surface of the upper molding die 40A. As an example, a fluorine resin sheet can be used as the synthetic resin sheet 44. Note that, in FIG. 4B, the synthetic resin sheet 44 is drawn to be thick in order to facilitate understanding of the structure.

Figure 4C:
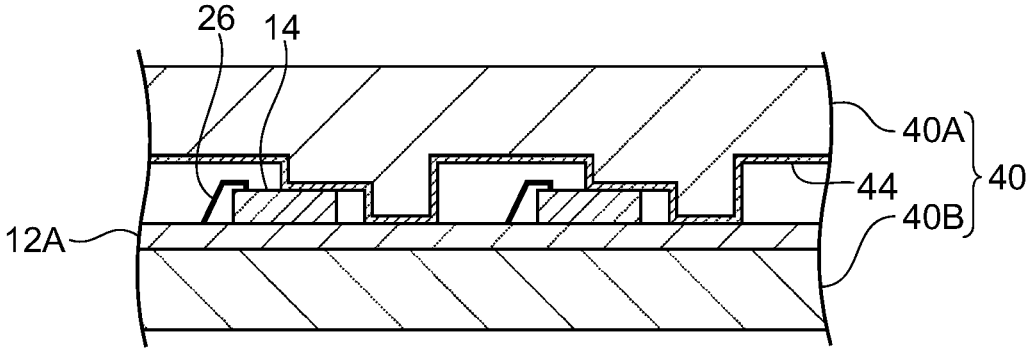
FIG. 4C is an explanatory drawing illustrating a step of carrying out resin molding.

(2) As illustrated in FIG. 4C, the continuous wiring substrate 12A on which the plural optical elements 14 are mounted is placed on the lower molding die 40B, and the molding die 40 is closed. Note that, at the continuous wiring substrate 12A, wiring of the bonding wires 26, which electrically connect the optical elements 14 and the wiring substrates, has been completed.

Figure 4D:
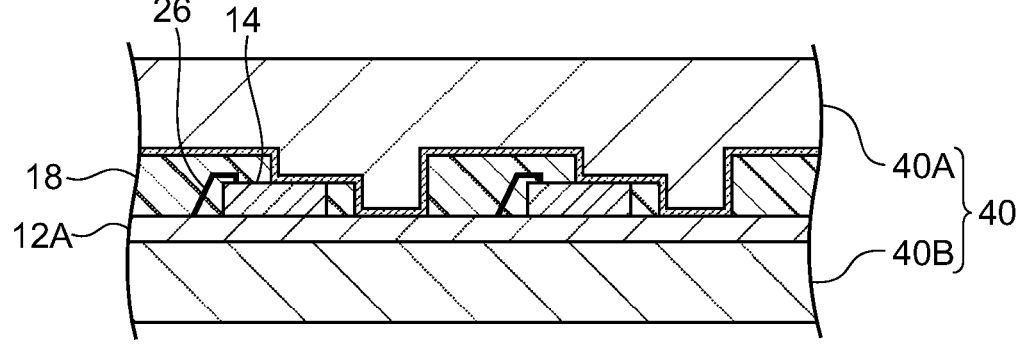
FIG. 4D is an explanatory drawing illustrating a step of carrying out resin molding.

(3) Next, as illustrated in FIG. 4D, resin in a molten state is injected into the interior of the cavity portion 42, and the bonding wires 26 and other necessary places are sealed by resin. Due thereto, the remaining portions that are other than the light-receiving portions 22 of the optical elements 14, and portions of the top surfaces of the optical elements at the peripheries of the light-receiving portions 22, and portions of the top surface of the continuous wiring substrate 12A on which the light-emitting elements 16 are to be mounted, are sealed by resin. Note that the bonding wires 26 are completely embedded within the resin.

Figure 5:
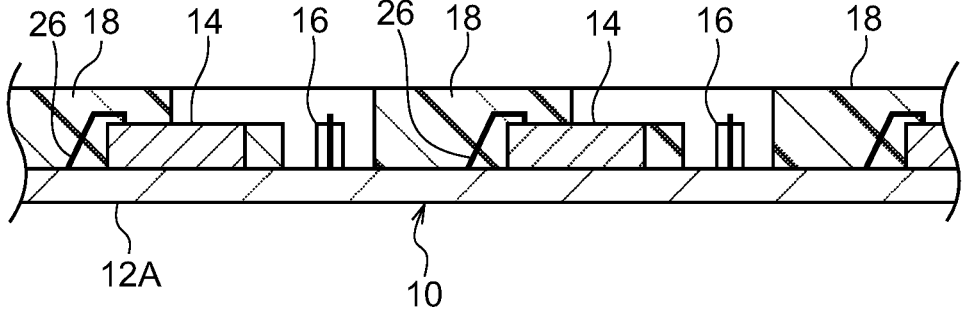
FIG. 5 is a cross-sectional view illustrating a continuous substrate on which resin molding has been carried out.

(4) After the resin cures, the molding die 40 is opened, and, as illustrated in FIG. 5, the continuous wiring substrate 12A is removed from the molding die 40, and the light-emitting elements 16 are mounted to portions of the wiring substrate 12A which portions are not sealed by the resin portions 18.

Figure 6:
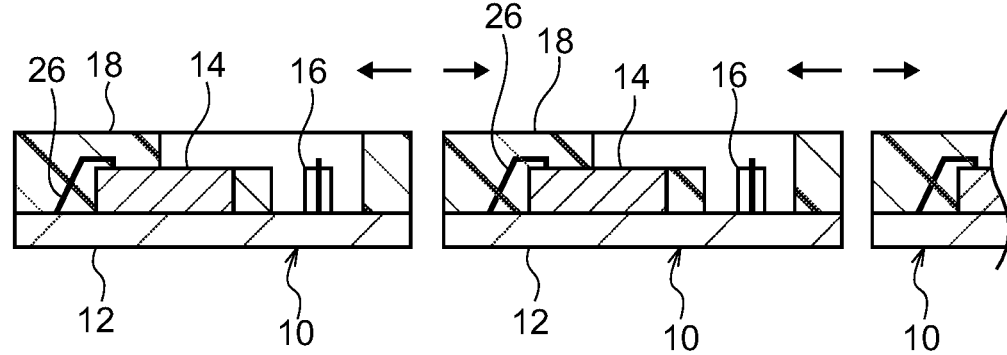
FIG. 6 is a cross-sectional view illustrating optical devices that have been individually cut.

(5) Thereafter, the continuous wiring substrate 12A is cut by an unillustrated dicing blade, and as illustrated in FIG. 6, the individual optical devices 10 are separated.

The optical device 10 illustrated in FIG. 1 is completed by the above-described steps.

Operation, Effects

At the optical device 10 of the present embodiment, the light emitted from the light-emitting element 16 is emitted via the through-portion 32 of the opening portion 28 (see FIG. 2B and FIG. 3A) toward an object of illumination (not illustrated) provided at the exterior, and the reflected light that is reflected at the object of illumination is received at the light-receiving portion 22 of the optical element 14.

Note that the optical device 10 of the present embodiment can be used at an encoder or the like as an example.

As illustrated in FIG. 2A and FIG. 3A, the length L1 in the left-right direction of the optical element 14 that is mounted to the wiring substrate 12 of the present embodiment is shorter than the length L0 of the bottom surface 30 in the left-right direction.

Figure 2C:
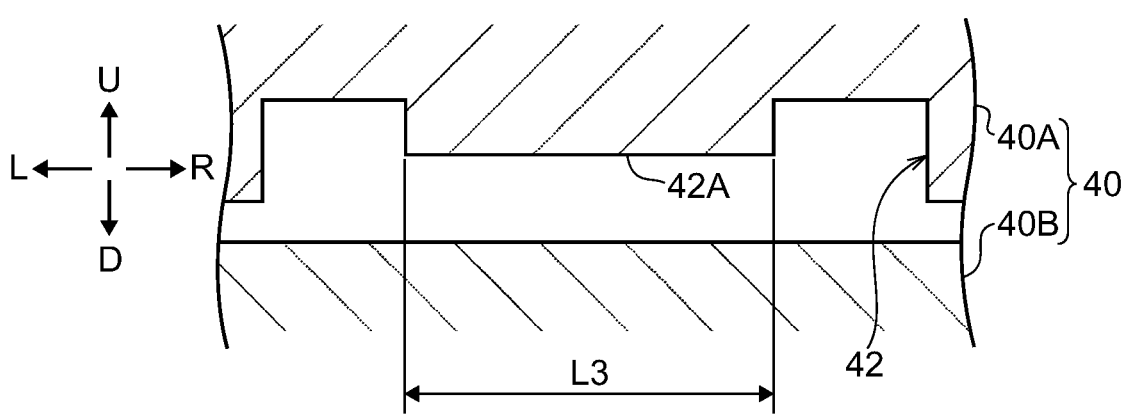
FIG. 2C is a cross-sectional view of a molding die that carries out resin molding (a cross-sectional view along line 2C-2C of FIG. 4A).

Further, at the cavity portion 42 of the upper molding die 40A in which the resin is filled, as illustrated in FIG. 2C, length L3 in the left-right direction of a convex portion 42A for forming the bottom surface 30 of the optical element 14 is equivalent to the length L0 of the bottom surface 30 in the left-right direction. (Note that the thickness of the synthetic resin sheet 44 that is thin is ignored.) Note that the peak surface (the bottom surface in FIG. 2C) of the convex portion 42A corresponds to the contacting portion of the present invention.

As illustrated in FIG. 2A, the length L1 of the optical element 14 of the present embodiment in the left-right direction is shorter than the length L3 in the left-right direction of the convex portion 42A of the upper molding die 40A. Therefore, even if the length L1 of the optical element 14 in the left-right direction is lengthened up to the length L0 of the bottom surface 30 in the left-right direction, the left and right upper surfaces of the optical element 14 are not covered by the resin portion 18.

In other words, by employing the structure of the optical device 10 of the present embodiment, the necessary places of the wiring substrate 12 on which is mounted the large-sized optical element 14, whose left-right length is longer than that of the optical element 14 of the size illustrated in FIGS. 1 through 3A and whose left and right top surfaces are not covered by the resin portion 18, can be sealed by resin without changing the molding die 40.

Namely, by making the optical device 10 have the structure of the above-described present embodiment, the molding die 40 can be used in common (standardized) for the light-receiving portions 22 and the optical elements 14 of various sizes, and manufacturing costs can be reduced.

Further, by making the length L1 of the optical element 14 in the left-right direction long, the length L2 in the left-right direction of the light-receiving portion 22 that is provided on the top surface of the optical element 14 can be made to be longer by the amount by which the left-right direction length of the optical element 14 is lengthened, and due thereto, the number of the photodiodes 22A (pixels) of the light-receiving portion 22 can be increased.

Note that it suffices to determine the dimensions (in the left-right direction and the front-rear direction) of the opening portion 28 and the bottom surface 30 in advance while taking into consideration the optical element 14 of the largest size that will be mounted on the wiring substrate 12. In other words, at the time of designing the molding die 40, it suffices to suppose the largest optical element 14, and to set in advance the dimensions of the portion that forms the opening portion 28.

Further, in accordance with the structure of the optical device 10 of the present embodiment, the width W2 of the light-receiving portion 22 in the front-rear direction is narrower than the width W1 in the front-rear direction of the optical element 14 that is exposed at the bottom surface 30. Therefore, the width W2 of the light-receiving portion 22 in the front-rear direction also can be made wider.

In accordance with the structure of the optical device 10 of the present embodiment, because the light-receiving portion 22 is small as compared with the size of the optical element 14 that is exposed at the bottom surface 30, the degrees of freedom in placement of the light-receiving portion 22 are large.

Note that, in the optical device 10 of the present embodiment, as illustrated in FIG. 2A, FIG. 2B and FIG. 3A, of the resin portion 18 that surrounds the periphery of the optical element 14, width A of the resin portion 18 between the through-portion 32 and one side of the optical element 14 is greater than width B of the resin portion 18 between the wall surface 28L, 28R of the opening portion 28 and another side that is adjacent to the one side of the optical element 14. However, the relationship of the magnitudes of width A and width B can be changed as needed, and may be set such that width A≤width B.

Note that, among this type of optical device, there are optical devices of a structure in which the resin molding is carried out such that the light-receiving portion and the wires are covered by a transparent resin. As compared with black resin that is used in general semiconductor devices, with a transparent resin, it is often the case that the reliability thereof with respect to reflow and temperature cycles and the like is low, and there are cases in which breakage of the bonding wires or the like occurs.

However, at the optical device 10 of the present embodiment, the light-receiving portion 22 is exposed by the opening portion 28, and a black resin that is highly reliable and is used at general semiconductor devices can be used at the resin portion 18. Therefore, high reliability that is similar to that of general semiconductor devices is obtained.

Second Embodiment

Figure 7:
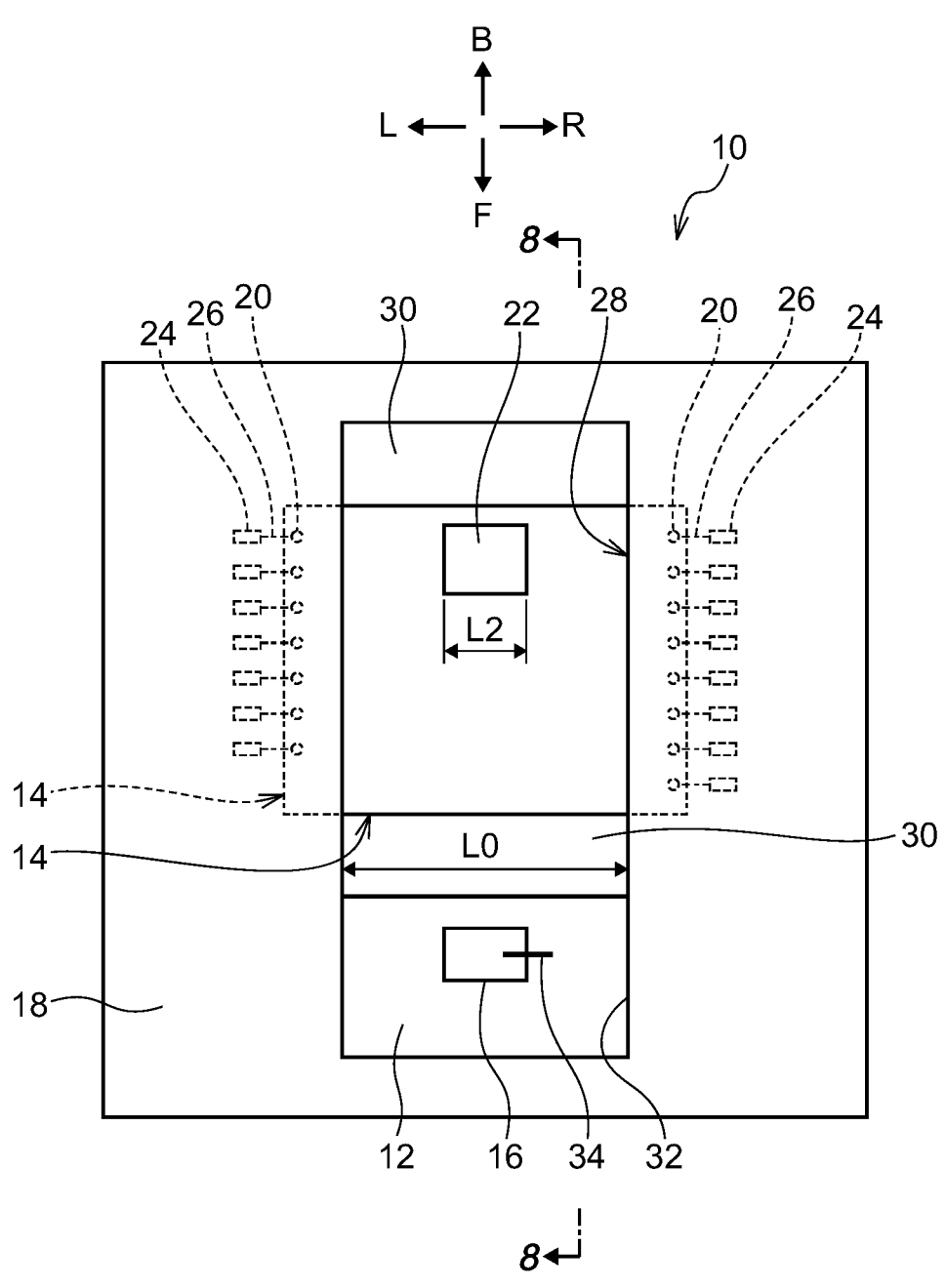
FIG. 7 is a plan view illustrating an optical device relating to a second embodiment.
Figure 8:
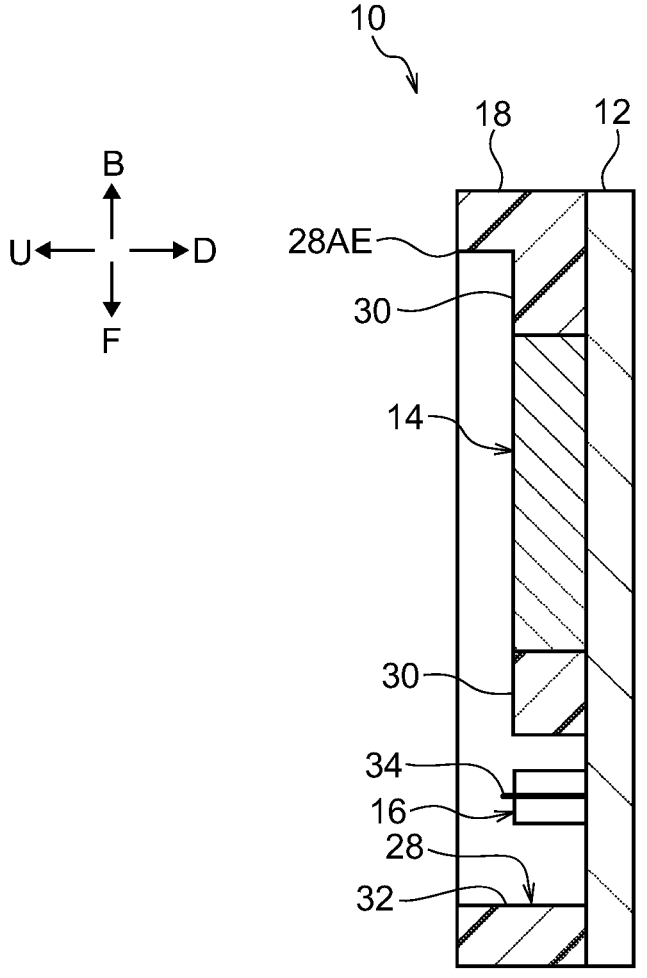
FIG. 8 is a cross-sectional view illustrating the optical device relating to the second embodiment (a cross-sectional view along line 8-8 of FIG. 7).

The optical device 10 relating to a second embodiment of the present invention is described in accordance with FIG. 7 and FIG. 8. Note that structures that are the same as those of the first embodiment are denoted by the same reference numerals, and description thereof is omitted.

In the optical device 10 of the present embodiment, the opening portion 28 that is formed in the resin portion 18 is formed in the shape of a rectangle that is long and narrow in the front-rear direction, and the optical element 14 that is long and narrow in the left-right direction is mounted to the wiring substrate 12. In the present embodiment, the bonding wires 26 are wired at the left and right both sides of the optical element 14.

In the optical device 10 of the present embodiment as well, the top surface of the optical element 14 that is exposed at the opening portion 28 is flush with the bottom surface 30 of the opening portion 28.

The light-receiving portion 22 that is rectangular is provided at the top surface of the optical element 14 toward the arrow B direction side.

The length L2 of the light-receiving portion 22 of the optical element 14 of the present embodiment in the left-right direction is shorter than the length L0 of the bottom surface 30 in the left-right direction. Therefore, in the same way as in the first embodiment, the optical element 14, which has the light-receiving portion 22 whose length L2 is longer, can be mounted to the wiring substrate 12 and sealed by resin, without changing the molding die.

Third Embodiment

Figure 9:
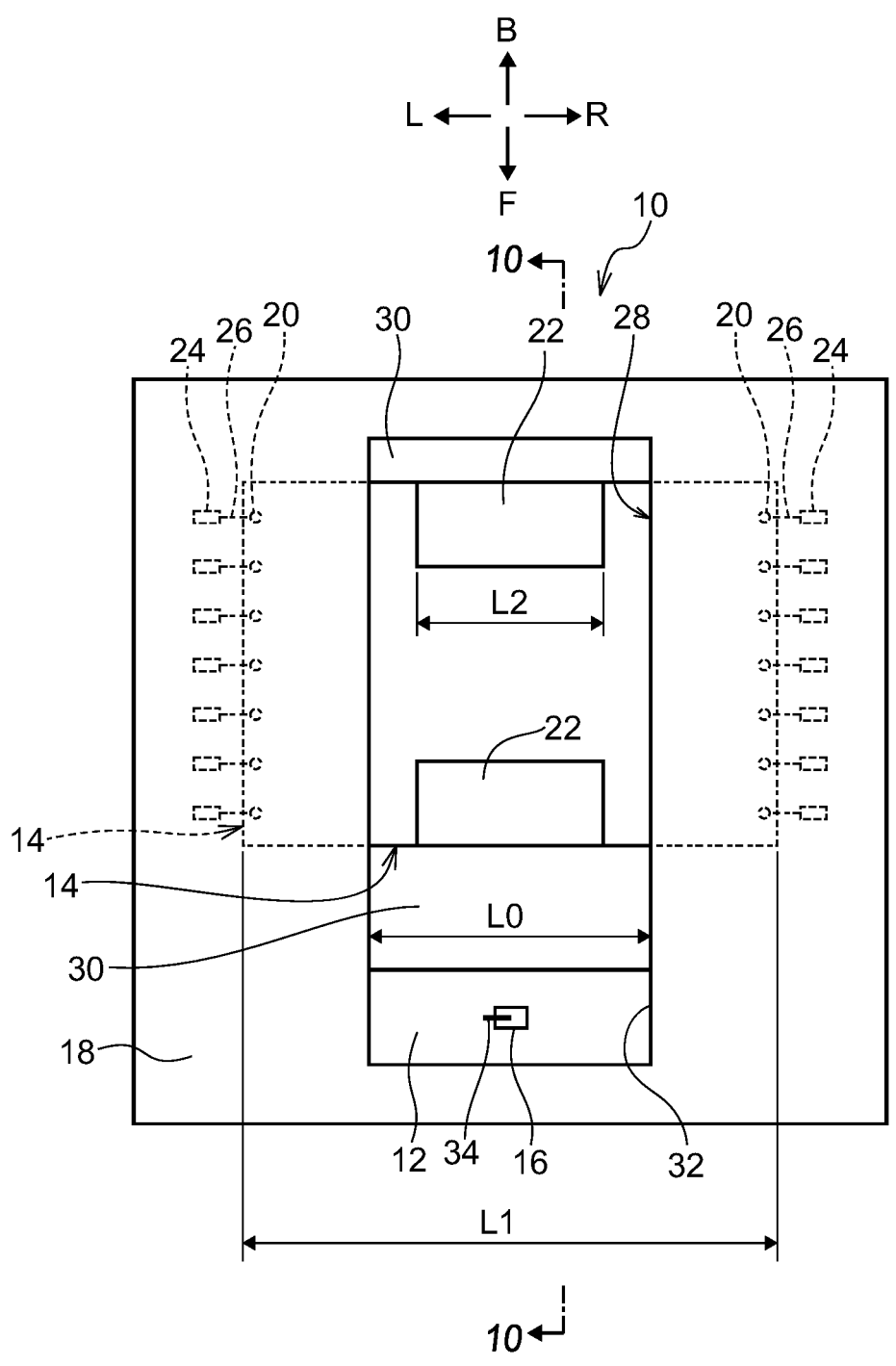
FIG. 9 is a plan view illustrating an optical device relating to a third embodiment.
Figure 10:
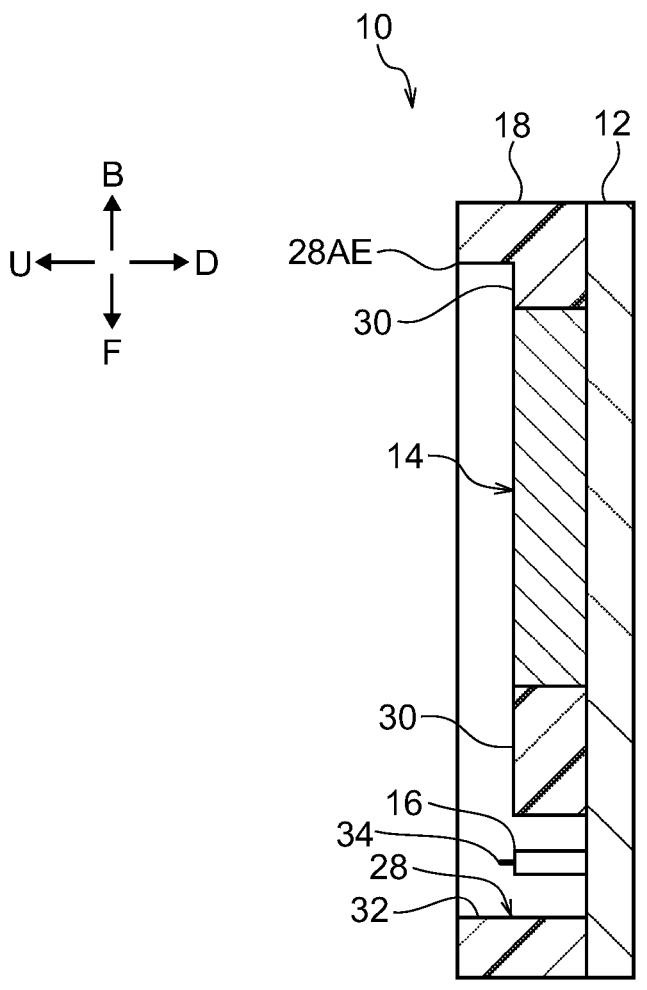
FIG. 10 is a cross-sectional view illustrating the optical device relating to the third embodiment (a cross-sectional view along line 10-10 of FIG. 9).

The optical device 10 relating to a third embodiment of the present invention is described in accordance with FIG. 9 and FIG. 10. Note that structures that are the same as those of the first embodiment are denoted by the same reference numerals, and description thereof is omitted.

In the same way as the optical device 10 of the second embodiment, at the optical device 10 of the present embodiment as well, the opening portion 28 that is formed in the resin portion 18 is formed in the shape of a rectangle that is long and narrow in the front-rear direction, and the optical element 14 that is long and narrow in the left-right direction is mounted to the wiring substrate 12. Further, the bonding wires 26 are wired at the left and right both sides of the optical element 14.

In the optical device 10 of the present embodiment as well, the top surface of the optical element 14 that is exposed at the opening portion 28 is flush with the bottom surface 30 of the opening portion 28.

The light-receiving portions 22 that are long and narrow in the left-right direction are provided at the top surface of the optical element 14 toward both the arrow F direction side and the arrow B direction side.

In the optical element 14 of the present embodiment as well, the length L2 of the light-receiving portions 22 in the left-right direction is shorter than the length L0 of the bottom surface 30 in the left-right direction. Therefore, in the same way as in the second embodiment, the optical element 14, which has the light-receiving portions 22 whose length L2 is longer, can be mounted to the wiring substrate 12 and sealed by resin, without changing the molding die.

Other Embodiments

Although embodiments of the present invention have been described above, the present invention is not limited to the above, and can, of course, be implemented by being modified in various ways other than the above, within a scope that does not depart from the gist thereof.

In the above-described first embodiment, the bonding wires 26 are wired at three sides of the optical element 14 that is formed in a rectangular shape. In the second embodiment and the third embodiment, the bonding wires 26 are wired at two sides of the optical element 14. However, the present invention is not limited to this, and it suffices for the bonding wires 26 to be wired at one side of the optical element 14.

The light-receiving portion 22 of the above-described embodiments is a structure in which the plural photodiodes 22A are arrayed along the length direction of the light-receiving portion 22. However, the arrangement of the photodiodes 22A is not particularly limited, and further, the light-receiving portion 22 may be a single photodiode 22A.

In the optical device 10 of the above-described embodiments, the light-emitting element 16 is provided at the wiring substrate 12. However, the light-emitting element 16 may be provided or may not be provided, as needed. At the optical device 10 at which the light-emitting element 16 is not provided, the through-portion 32 does not have to be provided at the opening portion 28.

In the optical device 10 of the above-described embodiments, the shape of the light-receiving portion 22 as seen in plan view is rectangular, but may be a shape other than rectangular, such as hexagonal, circular-arc-shaped, or the like.

What is claimed is:

1. An optical device, comprising:
   an optical element that is rectangular as seen in a top view, and that has a light-receiving portion at a top surface thereof;
   a wiring substrate on which the optical element is mounted;
   wires electrically connecting the optical element and the wiring substrate at from one to three sides of the rectangular optical element;
   a resin portion formed at a periphery of the optical element, and covering a portion of the top surface of the optical element including the wires; and an opening portion that is concave, that is provided in the resin portion, and that is formed by a molding die such that at least the light-receiving portion and the top surface at a periphery of the light-receiving portion are exposed,
   wherein the resin portion that structures a bottom surface at the opening portion is flush with the top surface,
   wherein a through-portion, which passes through the resin portion and exposes a surface of a portion of the wiring substrate, is provided at a portion of the opening portion, and
   a light-emitting element is provided at the wiring substrate that is exposed from the through-portion.

2. The optical device of claim 1, wherein the through-portion and the light-emitting element are separated by a gap.

3. The optical device of claim 1, wherein the bottom surface at the opening portion is flush with a top surface of the light-emitting element.

4. The optical device of claim 1, wherein the opening portion includes at least one side surface that is perpendicular to the top surface of the optical element.

5. The optical device of claim 1, wherein:
   connection terminals that connect the wires are not provided at two sides among four sides of the optical element, and
   light-receiving portions are provided respectively along the two sides at which the connection terminals are not provided.

6. The optical device of claim 5, wherein the light-receiving portions are formed in elongated shapes along the sides, and pluralities of pixels are arrayed along length directions of the light-receiving portions.

7. The optical device of claim 1, wherein the optical element includes a first side, and a second side opposite to the first side, the portion of the top surface of the optical element is covered by the resin on the first side, and is not covered by the resin on the second side.

8. The optical device of claim 7, wherein the optical element further includes a third side and a fourth side, each of the third and fourth side includes a portion of the top surface of the optical element not covered by the resin, and the resin portion that structures a bottom surface at the opening portion is flush with the top surface on the third side and fourth side.

9. The optical device of claim 7, wherein the light-emitting element is located on the second side of the optical element that is not covered by the resin.

* * * * *